(12) United States Patent
Du et al.

(10) Patent No.: US 10,276,301 B2
(45) Date of Patent: Apr. 30, 2019

(54) CURRENT TRANSFORMER AND DIRECT CURRENT SOURCE BASED ON CURRENT TRANSFORMER

(71) Applicant: Siemens Aktiengesellschaft, Munich (DE)

(72) Inventors: Feng Du, Shanghai (CN); Wei Gang Chen, Shanghai (CN); Yue Zhuo, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/708,186

(22) Filed: Sep. 19, 2017

(65) Prior Publication Data
US 2018/0090267 A1 Mar. 29, 2018

(30) Foreign Application Priority Data
Sep. 27, 2016 (CN) .......................... 2016 1 0856625

(51) Int. Cl.
*H01F 38/28* (2006.01)
*H01F 38/30* (2006.01)
(Continued)

(52) U.S. Cl.
CPC ............. *H01F 38/28* (2013.01); *H01F 38/30* (2013.01); *H01F 38/32* (2013.01);
(Continued)

(58) Field of Classification Search
CPC .......... H01F 38/28–38/32; H01F 38/38; H01F 38/40
See application file for complete search history.

(56) References Cited

U.S. PATENT DOCUMENTS

| 4,034,325 A * | 7/1977 | Zarkov | H01F 17/04 |
| | | | 336/132 |
| 2011/0032733 A1* | 2/2011 | Watanabe | H02J 1/10 |
| | | | 363/21.14 |
| 2012/0306473 A1 | 12/2012 | Chen et al. | |

FOREIGN PATENT DOCUMENTS

| CN | 102810912 A | 12/2012 |
| JP | 2001228181 A | 8/2001 |

OTHER PUBLICATIONS

Office Action for Chinese Patent Application No. 201610856625.7 dated Nov. 1, 2018.

* cited by examiner

*Primary Examiner* — Gary L Laxton
*Assistant Examiner* — Peter M Novak
(74) *Attorney, Agent, or Firm* — Harness, Dickey & Pierce, P.L.C.

(57) ABSTRACT

A current transformer and a direct current source based on a current transformer are disclosed. In an embodiment, the current transformer includes two output ends; a first winding and a second winding connected in series between the two output ends; a main core; a bypass core, arranged to be magnetically coupled with the main core. The first winding is wound on a part of the main core and a part of the bypass core, and the second winding is wound on apart of the bypass core. In an embodiment, the current transformer also includes a high-frequency bypass, connected in parallel with the first winding, and used to filter a high-frequency signal. The high-frequency bypass provides a low-impedance path for a high-frequency signal in a primary conductor under measurement, such that the bypass core with the second winding presents less obstruction to the main core, thereby reducing heating.

19 Claims, 3 Drawing Sheets

(51) Int. Cl.
*H01F 38/32* (2006.01)
*H03H 7/01* (2006.01)
*H03H 7/09* (2006.01)
*H02M 1/00* (2006.01)

(52) U.S. Cl.
CPC ............... *H02M 2001/0006* (2013.01); *H02M 2001/0009* (2013.01); *H03H 7/0115* (2013.01); *H03H 7/09* (2013.01)

CURRENT TRANSFORMER AND DIRECT CURRENT SOURCE BASED ON CURRENT TRANSFORMER

PRIORITY STATEMENT

The present application hereby claims priority under 35 U.S.C. § 119 to Chinese patent application number CN 201610856625.7 filed Sep. 27, 2016, the entire contents of which are hereby incorporated herein by reference.

FIELD

At least one embodiment of the present invention generally relates to a current transformer, in particular a current transformer for a self-powering device of a circuit breaker, and a direct current source based on the current transformer.

BACKGROUND

A current transformer for self-powering of a circuit breaker should generally output a sufficiently high energy at a small primary current, and at the same time should also be able to limit the size of the secondary current when the primary current is high, so as to prevent the breakdown of components in a rectifying circuit due to a large outputted secondary current. FIG. 1 shows a current transformer in one embodiment based on the prior art. This is also provided with a bypass core 12 beside a main core 11, in order to limit the secondary current. Such a design can achieve the effect of limiting current, but in the case where the primary current carries a high-frequency signal or harmonic signal, relatively serious heating will occur in the main core 11 and bypass core 12 as a result. Such heating might have an effect on a measurement current transformer close to the energy current transformer, and the power loss will cause an increase in the overall energy consumption of the circuit breaker.

SUMMARY

To solve one or more of the abovementioned problems, at least one embodiment of the present invention first of all provides a current transformer, comprising two output ends; a first winding and a second winding connected in series between the two output ends; a main core, having a closed magnetic loop; a bypass core, which may be independent of the main core, but is arranged to be magnetically coupled with the main core, wherein the first winding is wound on a part of the main core and a part of the bypass core, and the second winding is wound on apart of the bypass core; wherein the current transformer also comprises a high-frequency bypass, which is connected in parallel with the first winding, and used to filter a high-frequency signal. The high-frequency bypass provides a low-impedance path for a high-frequency signal in a primary conductor under measurement, such that the bypass core with the second winding presents less obstruction to the main core. Or, the provision of the high-frequency bypass helps the high-frequency signal to be conducted to the secondary side (i.e. the current transformer) relative to the primary conductor, thereby reducing the field current between the first winding and second winding, and in turn reducing heating.

Another embodiment of the present invention provides a direct current source based on a current transformer, comprising: a rectifying unit, and a current transformer according to any one of the disclosed embodiments, wherein the rectifying unit can be connected to two output ends of the current transformer. The direct current source based on a current transformer according to an embodiment of the present invention has low power loss, and the problem of heating is also solved effectively.

DESCRIPTION OF THE ACCOMPANYING DRAWINGS

The accompanying drawings below are merely intended to illustrate and explain embodiments of the present invention schematically, without limiting the scope thereof, wherein.

LIST OF LABELS USED IN THE DRAWINGS

Figure 1:
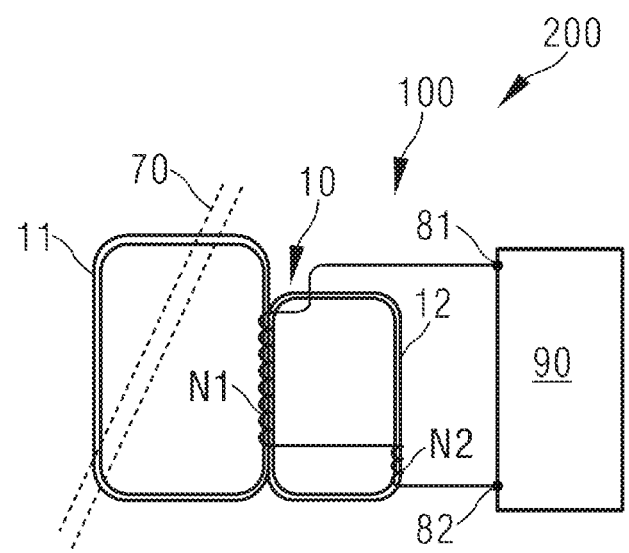
FIG. 1 shows by way of example an embodiment of a current transformer and a direct current source based on the current transformer.

10 power supply circuit
11 main core
12 bypass core
30 high-frequency bypass
70 primary conductor; AC electrical cable
81, 82 output ends of current transformer
90 rectifying circuit; rectifying unit; ACDC circuit
100 current transformer
200 direct current source based on current transformer
N1 first winding; secondary winding
N2 second winding; compensating winding
N3 short circuit winding; short circuit winding
N4 resonant winding
C1 high-pass capacitor
C2 resonant capacitor

DETAILED DESCRIPTION OF THE EXAMPLE EMBODIMENTS

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

To enable clearer understanding of the technical features, objectives and effects of the invention, particular embodiments of the present invention are now explained with reference to the accompanying drawings.

At least one embodiment of the present invention first of all provides a current transformer, comprising two output ends; a first winding and a second winding connected in series between the two output ends; a main core, having a closed magnetic loop; a bypass core, which may be independent of the main core, but is arranged to be magnetically coupled with the main core, wherein the first winding is wound on a part of the main core and a part of the bypass core, and the second winding is wound on a part of the bypass core; wherein the current transformer also comprises a high-frequency bypass, which is connected in parallel with the first winding, and used to filter a high-frequency signal. The high-frequency bypass provides a low-impedance path for a high-frequency signal in a primary conductor under measurement, such that the bypass core with the second winding presents less obstruction to the main core. Or, the provision of the high-frequency bypass helps the high-frequency signal to be conducted to the secondary side (i.e. the current transformer) relative to the primary conductor, thereby reducing the field current between the first winding and second winding, and in turn reducing heating.

According to an example embodiment, the high-frequency bypass is a high-pass filter circuit. Designing the high-frequency bypass as a high-pass filter circuit enables all signals with a frequency higher than a target frequency to be bypassed out. Such a design can reduce heating in the core components while limiting the secondary current, to reduce magnetic loss.

According to an example embodiment, the high-pass filter circuit comprises a high-pass capacitor. Those skilled in the art may specify a cut-off frequency according to the frequency of a high-frequency signal to be restricted, and in turn design the capacitance of a capacitive element. Furthermore, the high-pass filter circuit may also be an RC circuit.

According to an example embodiment, the high-frequency bypass is a resonant circuit. This enables a target high-frequency signal and a signal with a frequency close to the target high-frequency signal to pass the resonant circuit without any obstruction or with little obstruction, thereby reducing magnetic loss or heat loss.

According to an example embodiment, the resonant circuit is a series-connected resonant circuit.

More preferably, the series-connected resonant circuit comprises a series-connected resonant capacitor and a resonant winding, wherein the resonant winding is wound on a part of the bypass core. A series-connected resonant circuit is very practical in the current transformer, based on the fact that the size of the resonant winding and the resonant capacitor can be configured better.

According to an example embodiment, the resonant circuit is a parallel-connected resonant circuit.

Preferably, the parallel-connected resonant circuit comprises a parallel-connected resonant capacitor and a resonant winding, wherein the resonant winding is wound on a part of the bypass core.

According to an example embodiment, at least one short circuit winding is wound on the bypass core, and the short circuit winding is connected in a short-circuited manner. A magnetic flux formed by the short circuit winding due to excitation by a high-frequency signal can offset a part of a magnetic flux in the bypass core, and thereby reduce magnetic loss between the main core and bypass core. It is found by experimental verification that the power loss of the current transformer provided with the short circuit winding (i.e. the difference between the average power at the primary side and the power at the secondary side, i.e. the power outputted by the current transformer) remains at a low level as the frequency of the primary current increases.

Another embodiment of the present invention provides a direct current source based on a current transformer, comprising: a rectifying unit, and a current transformer according to any one of the embodiments above, wherein the rectifying unit can be connected to two output ends of the current transformer. The direct current source based on a current transformer according to an embodiment of the present invention has low power loss, and the problem of heating is also solved effectively.

FIG. 1 shows by way of example a current transformer 100, which comprises at least one power supply circuit 10, which has a main core 11, the main core 11 forming a closed magnetic circuit. A primary conductor under measurement, such as an AC electrical cable 70, may be arranged so as to be surrounded by the magnetic circuit. A secondary winding (or a secondary coil) N1 is wound on the main core 11, and a basic current transformer structure is thereby formed. The basic current transformer structure is known in the art, so is not described again here.

In the embodiment according to FIG. 1, a bypass core 12 is also provided beside the main core 11. The bypass core 12 also forms a magnetic loop. The bypass core 12 may be arranged to be separate from the main core 11, but is in addition designed to be capable of coupling magnetically with the main core 11, i.e. can weaken (or share the burden of) a magnetic flux produced in the main core 11 by the primary conductor. The secondary winding N1 is simultaneously wound round a part of the main core 11 and a part of the bypass core 12, or the secondary winding N1 is wound round the main core 11 and the bypass core 12 separately.

In order to reduce the magnetic flux passing through the secondary winding N1 on the main core 11 in the case where the a high-frequency signal is present in the primary conductor, the bypass core 12 may be designed to have an air gap (not shown in the figure). Thus, when there is a high-frequency current in the primary conductor, a high secondary current arises in the secondary winding N1, and then breaks through the air gap and opens up the bypass core 12, such that a portion of magnetic flux which was originally only in the main core 11 is shunted to the bypass core 12, and the magnetic flux through the secondary winding N1 is thereby reduced.

According to an embodiment of the present invention, a compensating winding N2 may also be wound on the bypass core 12, in order to better weaken the magnetic flux in the main core 11. The primary winding N1 and compensating winding N2 are connected in series. The result of such a design is that when the primary current is large, the size of the secondary current can be curbed effectively, and components in downstream circuitry are thereby protected.

As shown in the figure, in the current transformer 100, two output ends 81 and 82 of the current transformer 100 can be formed by two ends of the primary winding N1 and compensating winding N2, and used for connecting to a rectifying circuit 90 (or an ACDC circuit/unit), so as to form a DC source 200 based on the current transformer, which DC source may be used for a circuit breaker for example. Those skilled in the art will understand that the rectifying circuit 90 is also provided with an output end (though this is not shown in the figure), for outputting rectified direct current. Once the compensating winding N2 has been added, on the one hand, the shunting action of the bypass core 12 results in a drop in the magnetic flux through the secondary winding N1; on the other hand, the compensating winding N2 itself also forms an inductive load, and thereby has a limiting effect on the secondary current. However, it will be noticed that when the primary current carries a high-frequency signal or harmonic signal, magnetic loss causes heating in the cores, in particular the part between the main core 11 and bypass core 12, due to the fact that the secondary winding N1 and compensating winding N2 give rise to a field current.

Figure 2:
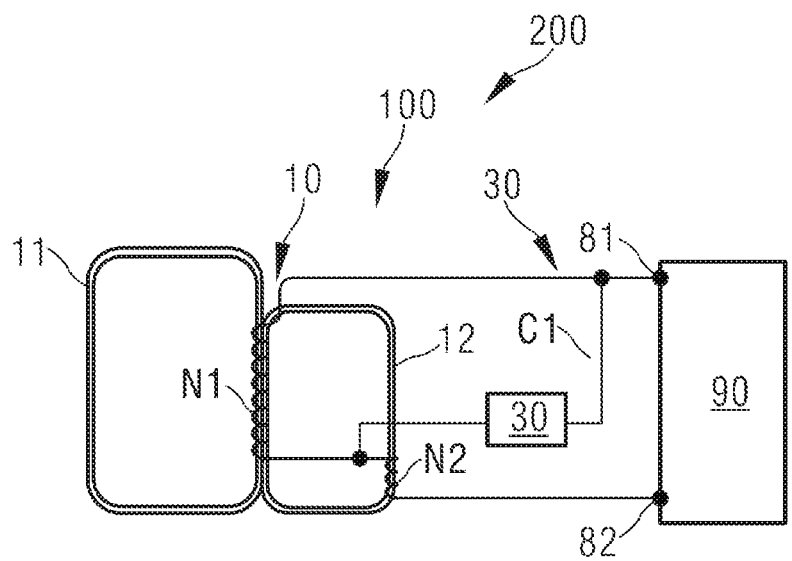
FIG. 2 shows by way of example an embodiment of a current transformer and a direct current source based on the current transformer according to an embodiment of the present invention.

FIG. 2 shows a current transformer 100, and a DC source 200 based on the current transformer, according to an example embodiment of the present invention. As shown in the figure, a high-frequency bypass 30 is connected in parallel with a secondary winding N1 in this embodiment; the high-frequency bypass is used to form a low-impedance path for a high frequency band signal to be filtered. The provision of the high-frequency bypass 30 helps the high-frequency signal to be conducted more easily to the secondary side (i.e. the current transformer 100) relative to the primary conductor, thereby reducing the field current, and in turn reducing heating caused by this magnetic loss.

Figure 3:
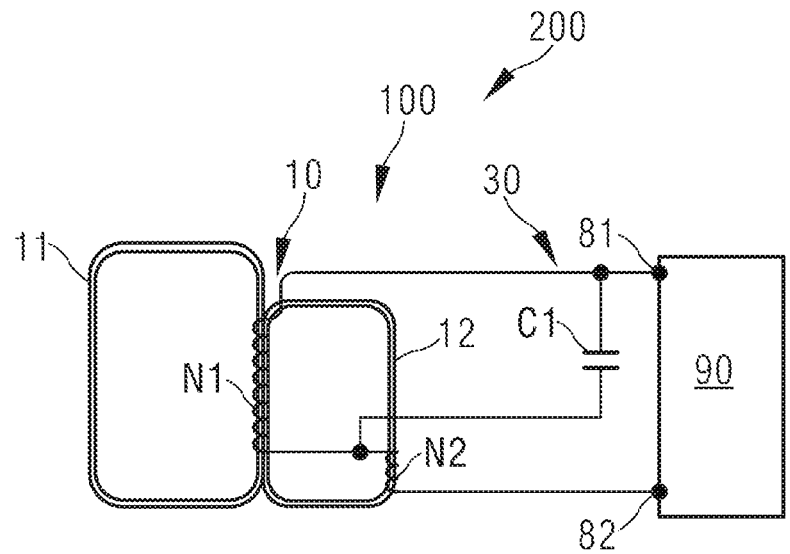
FIG. 3 shows by way of example an embodiment of a current transformer and a direct current source based on the current transformer according to an embodiment of the present invention.

Specifically, as shown by way of example in an embodiment shown in FIG. 3, the high-frequency bypass 30 may be designed as a high-pass filter circuit. In simple terms, the high-pass filter circuit is designed to comprise a high-pass capacitor C1. Those skilled in the art may specify a cut-off frequency according to the frequency of a target high-frequency signal to be restricted, and in turn design the capacitance of a capacitive element. Thus, all signals with a frequency higher than that of the target high-frequency signal can be bypassed out. The specific method of calculating capacitance is known in the art, so is not described again here. Such a design can reduce heating in the core components while limiting the secondary current, to reduce magnetic loss. Clearly, the high-pass filter circuit according to the present invention could also be an RC circuit, though this is not shown. Correspondingly, the sizes of the capacitor and resistor in the RC circuit could also be designed/calculated.

FIG. 3 further shows another example embodiment according to the present invention, which differs from the embodiment shown in FIG. 2 in that the current transformer 100 also comprises a short circuit winding N3, which is connected so as to be short circuited with itself, and is wound on the bypass core 12. The short circuit winding N3 may be designed to have a very small impedance; a magnetic flux formed thereby can offset apart of a magnetic flux which arises in the bypass core 12 due to a high-frequency signal, and thereby reduce heat loss between the main core 11 and bypass core 12. It is worth noting that when the short circuit winding N3 is provided according to the solution shown in FIG. 3, it is found by experimental verification that the power loss of the current transformer 100 (i.e. the difference between the average power at the primary side and the power at the secondary side, i.e. the power outputted by the current transformer) remains at a low level as the frequency of the primary current increases, and the power loss can be reduced by about 90% when the primary current frequency is high.

The high-frequency bypass 30 connected in parallel with the secondary winding N1 may also be designed as a resonant circuit, to enable a high-frequency signal to reach the secondary side smoothly.

Figure 4:
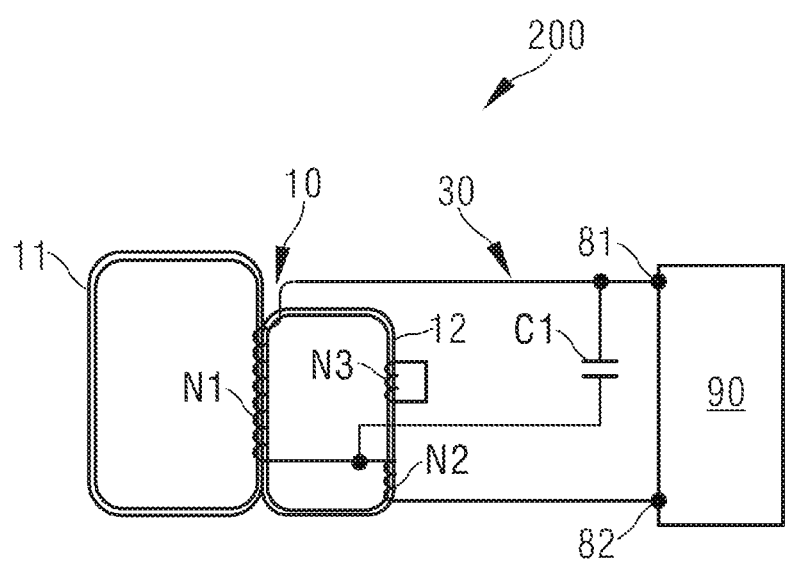
FIG. 4 shows by way of example an embodiment of a current transformer and a direct current source based on the current transformer according to an embodiment of the present invention.

FIG. 4 shows an example embodiment according to the present invention. For example, the resonant circuit may be a series-connected resonant circuit, comprising a series-connected resonant winding N4 and a resonant capacitor C2, wherein the resonant winding N4 is wound on the bypass core 12. A resonant circuit designed in this way is also called a wave trap, and enables a target high-frequency signal (such as a signal of several thousand Hertz) and a signal with a frequency close to the target high-frequency signal to pass through the resonant circuit without any obstruction or with little obstruction, thereby reducing magnetic loss or heat loss. The inductance of the resonant winding and the size of the resonant capacitor may be calculated by the following formula:

$$f = \frac{1}{2\pi}\sqrt{\frac{1}{L \cdot C}} \qquad (1)$$

where f is the frequency of the target high-frequency signal, L is the inductance of the resonant winding and C is the capacitance of the resonant capacitor.

The inductance of the resonant winding and the size of the resonant capacitor may be matched with each other to achieve filtering of the target high-frequency signal. Similarly to the embodiments shown in FIG. 2 and FIG. 3, in this embodiment, the secondary winding N1 may be wound on the main core 11 and the bypass core 12 separately, or the secondary winding N1 may be directly wound on the main core 11 and the bypass core 12 simultaneously. The secondary winding N1 and compensating winding N2 are wound in the same direction, and the resonant winding N3 is wound in the opposite direction to that of the secondary winding. However, the compensating winding N2 may also be wound in the opposite direction to that of the secondary winding N1, in which case it is necessary to adjust the number of turns of the compensating winding N2, to achieve the same result. The winding direction and number of turns of the resonant winding N3 may also be correspondingly adjusted.

Figure 5:
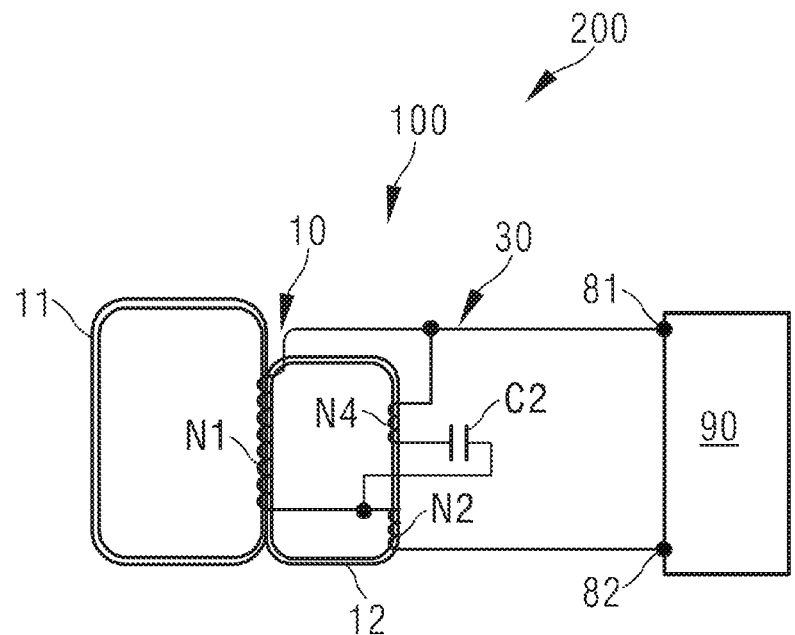
FIG. 5 shows by way of example an embodiment of a current transformer and a direct current source based on the current transformer according to an embodiment of the present invention.
Figure 6:
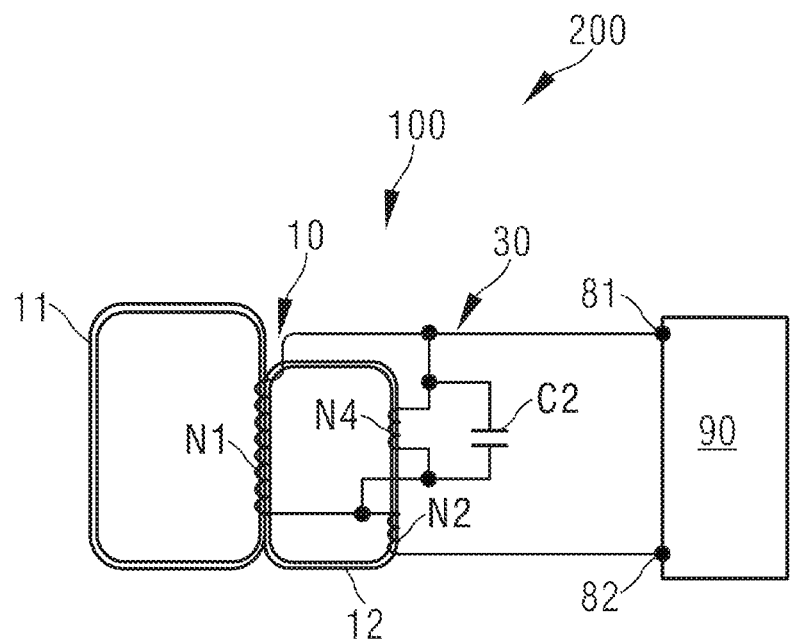
FIG. 6 shows by way of example an embodiment of a current transformer and a direct current source based on the current transformer according to an embodiment of the present invention.

FIG. 5 shows schematically a variation of an embodiment according to the present invention, wherein for example the resonant circuit may be a parallel-connected resonant circuit, comprising a parallel-connected resonant winding N4 and a resonant capacitor C2, wherein the resonant winding N4 is wound on the bypass core 12. This can realize a function similar to that of the series-connected resonant circuit, wherein the inductance of the resonant winding and the size of the resonant capacitor may be calculated by the following formula:

$$f = \frac{1}{2\pi\sqrt{LC}} \quad (2)$$

Clearly (though this is not shown), when the high-frequency bypass circuit is designed as a resonant circuit (e.g. in the embodiments shown in FIGS. 4 and 5), the current transformer 100 may also comprise a short circuit winding N3, which is connected so as to be short circuited with itself, and is wound on a part of the bypass core 12. The short circuit winding N3 may be designed to have a very low impedance, to form a magnetic flux to offset part of a magnetic flux in the bypass core. The provision of the short circuit winding N3 significantly reduce heating caused by a high-frequency signal.

It should be understood that although the description herein is based on various embodiments, it is by no means the case that each embodiment contains just one independent technical solution. Such a method of presentation is adopted herein purely for the sake of clarity. Those skilled in the art should consider the description in its entirety. The technical solutions in the various embodiments could also be suitably combined to form other embodiments capable of being understood by those skilled in the art.

The embodiments above are merely particular schematic embodiments of the present invention, which are not intended to limit the scope thereof. All equivalent changes, amendments and combinations made by any person skilled in the art without departing from the concept and principles of the present invention shall fall within the scope of protection thereof.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A current transformer, comprising:
   a direct current (DC) input and an alternating current (AC) output;
   two transformer output ends;
   a first winding and a second winding, connected in series between the two output transformer ends;
   a main core, including a closed magnetic loop;
   a bypass core, arranged to be magnetically coupled with the main core, the first winding being wound on a part of the main core and a part of the bypass core, and the second winding being wound on a part of the bypass core; and
   a high-frequency bypass, connected in parallel with the first winding, to filter a high-frequency signal.

2. The current transformer of claim 1, wherein the high-frequency bypass is a high-pass filter circuit.

3. The current transformer of claim 2, wherein the high-pass filter circuit includes a high-pass capacitor.

4. The current transformer of claim 3, wherein at least one short circuit winding is wound on the bypass core, wherein the at least one short circuit winding is connected in a short-circuited manner.

5. A direct current source based on a current transformer, comprising:
   a rectifying unit; and
   the current transformer of claim 3, wherein the rectifying unit is connectable to the two transformer output ends of the current transformer.

6. The current transformer of claim 2, wherein at least one short circuit winding is wound on the bypass core, wherein the at least one short circuit winding is connected in a short-circuited manner.

7. A direct current source based on a current transformer, comprising:
   a rectifying unit; and
   the current transformer of claim 2, wherein the rectifying unit is connectable to the two transformer output ends of the current transformer.

8. The current transformer of claim 1, wherein the high-frequency bypass is a resonant circuit.

9. The current transformer of claim 8, wherein the resonant circuit is a series-connected resonant circuit.

10. The current transformer of claim 9, wherein the series-connected resonant circuit includes a series-connected resonant capacitor and a resonant winding, wherein the resonant winding is wound on a part of the bypass core.

11. The current transformer of claim 9, wherein at least one short circuit winding is wound on the bypass core, wherein the at least one short circuit winding is connected in a short-circuited manner.

12. A direct current source based on a current transformer, comprising:
   a rectifying unit; and
   the current transformer of claim 9, wherein the rectifying unit is connectable to the two transformer output ends of the current transformer.

13. The current transformer of claim 8, wherein the resonant circuit is a parallel-connected resonant circuit.

14. The current transformer of claim 13, wherein the parallel-connected resonant circuit includes a parallel-connected resonant capacitor and a resonant winding, and wherein the resonant winding is wound on a part of the bypass core.

15. The current transformer of claim 13, wherein at least one short circuit winding is wound on the bypass core, wherein the at least one short circuit winding is connected in a short-circuited manner.

16. A direct current source based on a current transformer, comprising:
   a rectifying unit; and
   the current transformer of claim 13, wherein the rectifying unit is connectable to the two transformer output ends of the current transformer.

17. The current transformer of claim 8, wherein at least one short circuit winding is wound on the bypass core, wherein the at least one short circuit winding is connected in a short-circuited manner.

18. A direct current source based on a current transformer, comprising:
   a rectifying unit; and
   the current transformer of claim 8, wherein the rectifying unit is connectable to the two transformer output ends of the current transformer.

19. A direct current source based on a current transformer, comprising:
   a rectifying unit; and
   the current transformer of claim 1, wherein the rectifying unit is connectable to the two transformer output ends of the current transformer.

* * * * *